United States Patent [19]

Matsumura

[11] Patent Number: 5,226,713
[45] Date of Patent: Jul. 13, 1993

[54] STORAGE VESSEL

[75] Inventor: Masao Matsumura, Chigasaki, Japan

[73] Assignee: Ebara Corporation, Tokyo, Japan

[21] Appl. No.: 633,855

[22] Filed: Dec. 26, 1990

[30] Foreign Application Priority Data

Dec. 28, 1989 [JP] Japan .................. 1-343840

[51] Int. Cl.⁵ .............................. A47B 95/00
[52] U.S. Cl. ........................ 312/305; 248/206.5;
384/446
[58] Field of Search ............ 312/125, 135, 248, 305;
248/206.5, 217; 384/446, 445; 318/90.5

[56] References Cited

U.S. PATENT DOCUMENTS

| | | | |
|---|---|---|---|
| 2,044,518 | 6/1936 | Thorstensen | 312/125 |
| 2,346,914 | 4/1944 | Drucker | 312/135 |
| 3,000,379 | 9/1961 | Viers | 600/21 |
| 3,650,039 | 3/1972 | Harding | 312/31 |
| 3,811,740 | 5/1974 | Sacerdoti et al. | |
| 4,250,666 | 2/1981 | Rakestraw | 312/135 |

FOREIGN PATENT DOCUMENTS 0630711 10/1968 Switzerland .......... 310/90.5
2199022 6/1988 United Kingdom .

OTHER PUBLICATIONS

Technische Rundschau, vol. 80, No. 22, May 27, 1988, pp. 64–66; Traxler & Salm; 'Aktive magnetische Rotorlagerung'.

Primary Examiner—James R. Brittain
Assistant Examiner—Gerald A. Anderson
Attorney, Agent, or Firm—Armstrong, Westerman, Hattori, McLeland & Naughton

[57] ABSTRACT

A storage vessel maintaining clean environment for storing articles such as semiconductor wafers includes a plurality of receiver fixed to a shaft for horizontal rotation. The receivers support carriers having the articles therein. Both thrust and radial bearings supporting the shaft are of a non-contacting magnetic type. The shaft is driven by a motor with a rotor fixed to the shaft and a stator facing the rotor. The vessel may have a vacuum or be charged with inert gas.

8 Claims, 2 Drawing Sheets

STORAGE VESSEL

BACKGROUND OF THE INVENTION

1. Field of the Invention

This invention relates to a storage vessel which maintains a clean environment and stores such articles as those to be free from contamination. More particularly, this invention relates to a storage vessel which stores such articles as semiconductor wafers, compact discs, etc.

2. Prior Art

A prior art storage vessel is shown in FIG. 2. In FIG. 2, the vessel has a storage vessel case 41 housing a shaft 42 which is rotatably supported by a bearing 45 fixed to the case 41 via a support. A plurality of carrier receivers 43 are circumferentially disposed on shaft 42, on which stock shelves or carriers 47 are located spaced a certain distance from the shaft.

An AC servomotor 46 fixed to the case 41 via the support drives the shaft 42 and consequently the plurality of carrier receivers 43 will rotate in a generally horizontal plane. An air supply duct 48 provided on the upper part of the storage vessel case is furnished with a filter 49, and air introduced through the air supply duct 48 as shown by broken lines and arrows A is filtered by the filter 49 and lead into the storage vessel case. In addition, an air circulating blower 50 is equipped at the lower part of the storage vessel case 41, and air blown by the blower 50 is filtered by a filter 51 and circulated in the storage vessel case 41 as shown by broken lines and arrows B.

In case articles such as wafers should be stored for a long period of time, the storage vessel may be provided with a nitrogen sealing system and/or a temperature control system, or the like, to prevent the article surfaces from being oxidized.

The bearing 45 used in the above-mentioned storage vessel is of a contacting type, which caused problems by generating oil mist or dust thus contaminating stored articles being kept for a long period of time.

SUMMARY OF THE INVENTION

It is an object of this invention to provide a storage vessel which eliminates the above-mentioned problems and in which stored articles such as semiconductor wafers, compact discs, etc. are not contaminated even when stored for a long period of time.

This object of the invention is achieved by an arrangement comprising a storage vessel case, in which a shaft is rotatably disposed for rotation about its axis, a plurality of receivers spaced from each other along the shaft and extending from the shaft for supporting a plurality of article carriers thereon, a non-contacting type support means for rotatably supporting the shaft and receivers within the storage vessel case without direct contact between the shaft and the storage vessel case, and a driving means for causing the shaft to rotate within the storage vessel case.

According to a second aspect of the present invention, there is provided a storage vessel, in which the support means includes a non-contacting type thrust magnetic bearing.

According to a third aspect of the present invention, there is provided a storage vessel, in which the support means includes a non-contacting type radial magnetic bearing.

According to a fourth aspect of the invention, there is provided a storage vessel, in which the driving means includes a motor comprising a rotor fixed to the shaft and a stator facing the rotor.

According to a fifth aspect of the invention, there is provided a storage vessel, in which the storage vessel case maintains a vacuum in it.

According to a sixth aspect of the invention, there is provided a storage vessel, in which the storage vessel case maintains an atmosphere of inert gas in it.

According to a seventh aspect of the invention, there is provided a storage vessel comprising a storage vessel case, a rotatable shaft disposed within the storage vessel case for rotation about its axis, a plurality of receivers spaced from each other along the shaft and extending from the shaft for supporting a plurality of article carriers thereon, a non-contacting type support means for rotatably supporting the shaft and receivers within the storage vessel case without direct contact between the shaft and the storage vessel case, in which the support means includes a non-contacting type thrust magnetic bearing and a non-contacting type radial magnetic bearing, and a driving means for causing the shaft to rotate within the storage vessel case, in which the driving means includes a motor comprising a rotor fixed to the shaft and a stator facing the rotor.

According to a eighth aspect of the invention, there is a storage vessel comprising a storage vessel case, in which the storage vessel case maintains one of a vacuum and an atmosphere of inert gas in it, a rotatable shaft disposed within the storage vessel case for rotation about its axis, a plurality of receivers spaced from each other along the shaft and extending from the rotatable shaft for supporting a plurality of article carriers thereon, a non-contacting type support means for rotatably supporting the shaft and receivers within the storage vessel case without direct contact between the shaft and the storage vessel case, in which the support means includes a non-contacting type thrust magnetic bearing and a non-contacting type radial magnetic bearing and a driving means for causing the shaft to rotate within the storage vessel case, in which the driving means includes a motor comprising a rotor fixed to the shaft and a stator facing the rotor.

The present invention will be more apparent from the following detailed description, when taken in conjunction with the accompanying drawings.

DETAILED DESCRIPTION OF THE PREFERRED EMBODIMENTS

Figure 1:
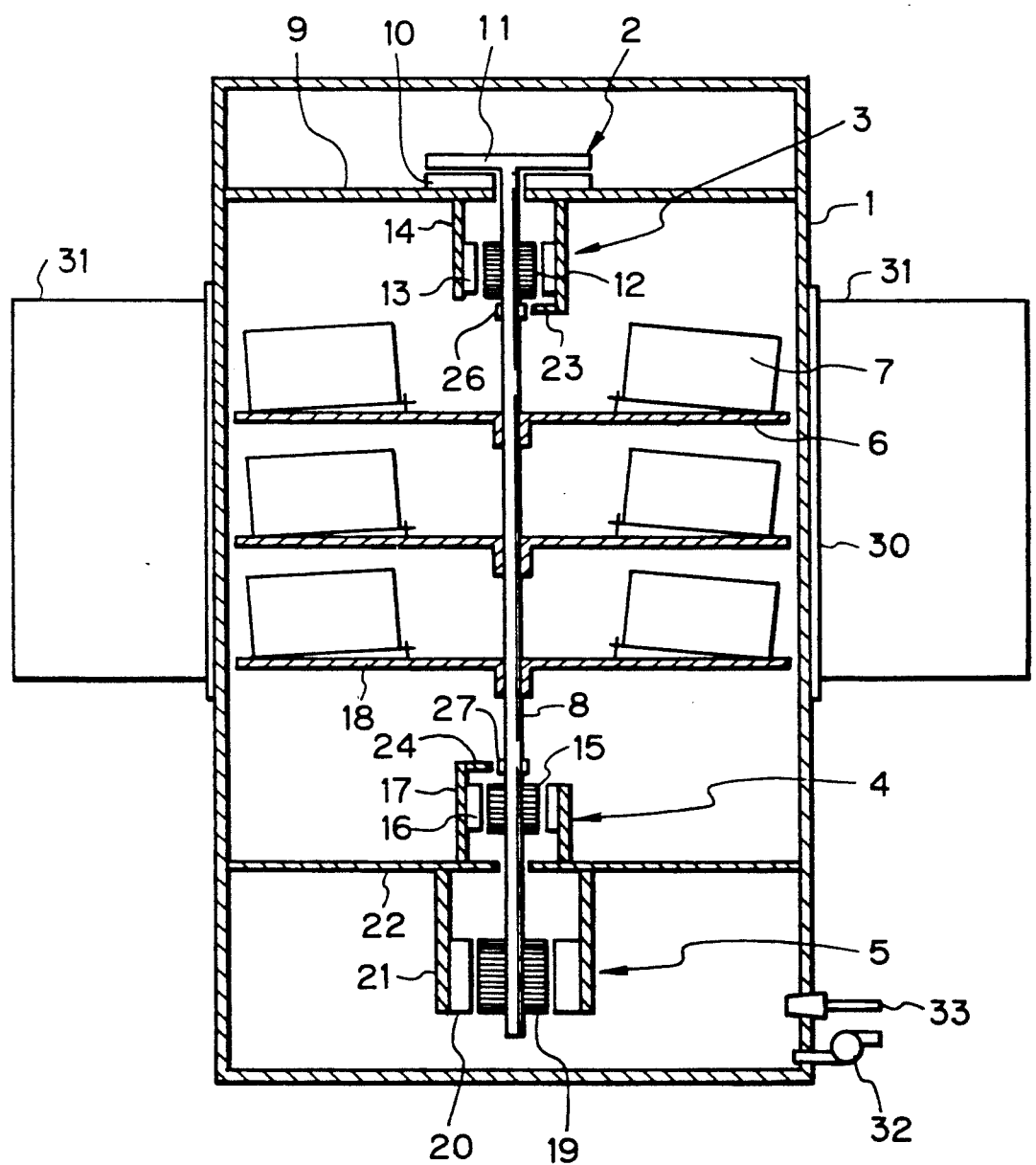
FIG. 1 is a vertical and central sectional drawing of a storage vessel in accordance with the present invention.
Figure 2:
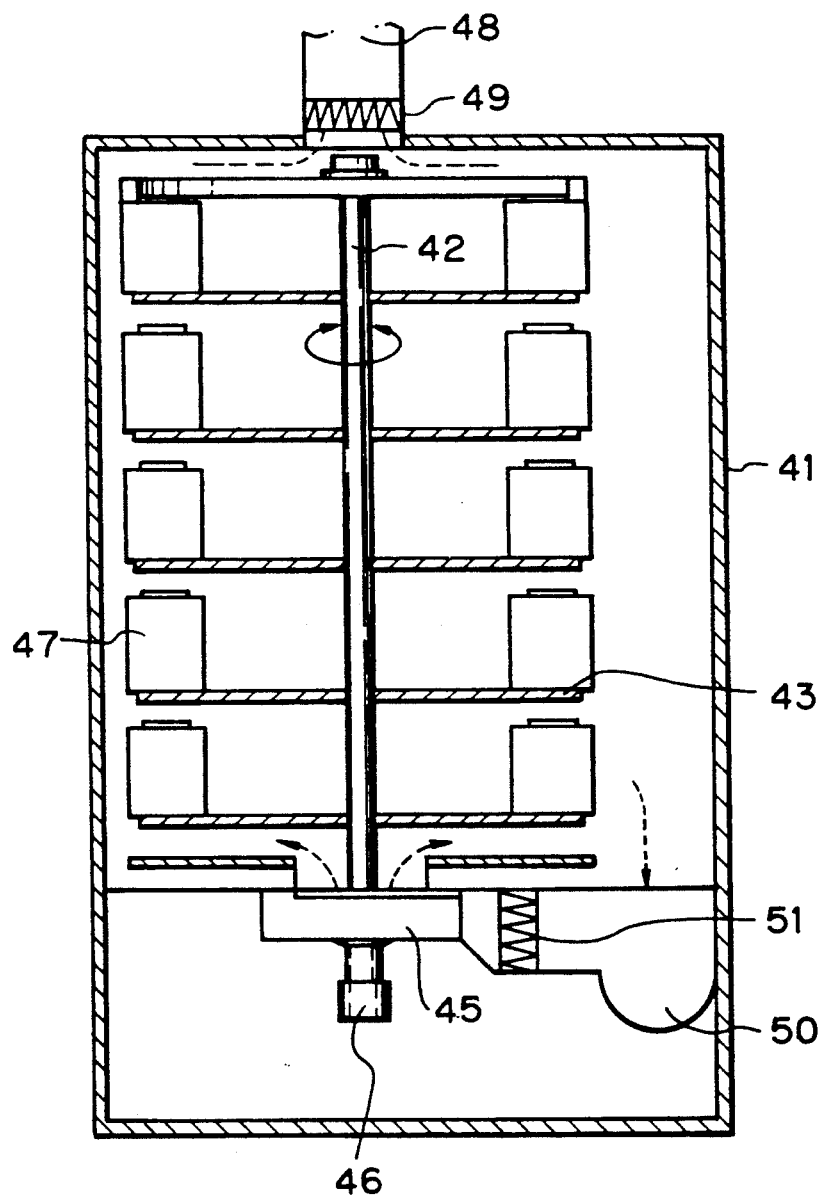
FIG. 2 is a vertical and central sectional drawing of a storage vessel in accordance with the related art.

A storage vessel in accordance with a preferred embodiment of the invention includes a cylindrical or box shaped storage vessel case 1, in which a shaft 8 fixed with a plurality of stages (three stages shown in FIG. 1) of disk shaped receivers 6 is rotatably supported by a non-contacting type thrust magnetic bearing 2 and upper and lower non-contacting type radial magnetic bearings 3 and 4. The receivers 6 have a structure which allows the air or a gas to pass therethrough. A motor 5 to drive the rotating shaft 8 is arranged at the bottom end of the shaft 8, i.e. the opposite end with respect to the thrust magnetic bearing 2.

The thrust magnetic bearing 2 comprises a magnet 10 which is supported by a support plate 9 fixed to the storage vessel case 1. A magnet 11 is fixed at the upper end of the rotating shaft 8. The magnets 10 and 11 have the same pole at facing sides, and thus the force of repulsion supports the rotating shaft 8 in an axially non-contacting manner. The magnet 10 may be either a permanent magnet or an electromagnet. In the case of an electromagnet, a sensor is provided to sense the displacement of the shaft 8 in the thrust or vertical direction and the current supplied to the electromagnet is controlled by the sensor.

The upper radial magnetic bearing 3 comprises a magnetic pole core 12 fixed to the shaft 8 and an exciting coil 13. A magnetic force to pull the magnetic pole core 12 is generated when supplying exciting current to the exciting coil 13, and thus the shaft 8 is supported in a radially or laterally non-contacting manner. The exciting coil 13 is fixed to the support plate 9 through a supporting element 14.

The lower radial magnetic bearing 4 also comprises a magnetic pole core 15 fixed to the shaft and an exciting coil 16, like the aforementioned upper radial magnetic bearing 3. A magnetic force to pull the magnetic pole core 15 is generated when supplying exciting current to the exciting coil 16, and thus the shaft 8 is supported in a radially or laterally non-contacting manner. The exciting coil 16 is fixed to the support plate 22 by a supporting element 17. The support plate 22 is fixed to the storage vessel case 1.

The motor 5 comprises a rotor 19 fixed to the shaft 8 and a stator 20 which is arranged facing the rotor 19. Rotating magnetic field generated in the stator 20 moves the rotor 19 and consequently turns the shaft 8. The stator 20 is fixed to the support plate 22 through the supporting element 21.

An upper radial sensor 23 senses the radial direction displacement of the upper part of the shaft 8 relative to the storage vessel case 1. Reference numeral 24 is a lower radial sensor to sense the radial direction displacement of the lower part of the shaft 8 relative to the storage vessel case 1. Reference numerals 26 and 27 are targets of the upper radial sensor 23 and the lower radial sensor 24, respectively. They are fixed to the shaft 8. The upper radial sensor 23 and the lower radial sensor 24 sense the upper and lower parts of the shaft 8 and the exciting currents supplied to the exciting coils 13 and 16 are controlled in response to the outputs of sensors 23 and 24 in order to support the shaft 8 in a non-contacting manner. Consequently, the shaft 8 is always maintained in its centered position. By this arrangement, since there is a restoring force against external forces, no external force can cause any damage to stored articles such as a semiconductor wafer.

A door 30, when opened, allows access to a carrier 7 put on the receiver 6 so that it may be removed from the storage vessel case. In case the storage vessel is maintained with a vacuum, a load lock chamber 31 controls the pressure.

In the above-mentioned storage vessel, when furnished with a vacuum pump 32 to maintain a vacuum within the storage vessel cases 1, a stored article in a carrier put on a receiver can be stored in a clean condition for a long period of time.

It is also possible that a carrier box on the receiver 6 may retain a vacuum therein and an inert gas such as nitrogen is charged and sealed in the storage vessel case 1 by a gas charging means 33. Further, clean air can be supplied by a clean air supplying means (not shown in the drawing) to store an article stored in the carrier box in a clean condition for a long period of time.

By constructing the storage vessel as mentioned above, i.e. by having a non-contacting thrust bearing and a non-contacting radial bearing, and the driving means with the rotor fixed to the shaft and with the stator facing the rotor, it is possible to keep stored articles clean for a long period of time, since no oil mist, dust or the like is generated from the bearings or the motor.

In addition, when a means for providing a vacuum in the storage vessel case is used, the effect of maintaining stored articles in a clean state may be increased.

Further, when a means is provided for charging inert gas in the storage vessel case, it is possible to keep stored articles clean for a long period of time; by charging the storage vessel with inert gas and providing a vacuum in the carrier box containing the stored article.

What is claimed is:

1. A storage vessel for articles, comprising:
   a storage vessel case;
   a shaft rotatably disposed within said storage vessel case for rotation about an axis of said shaft;
   a plurality of receivers spaced from each other along said shaft and extending from said shaft for supporting a plurality of article carriers thereon;
   a non-contacting type support means for rotatably supporting said shaft and receivers within said storage vessel case without direct contact between said shaft and any shaft-support element of said support means; and
   a driving means for causing said shaft to rotate within said storage vessel case, said driving means including a rotor causing said shaft to rotate and means provided within said storage vessel for rotating said rotor and said shaft without direct contact with said rotor or said shaft.

2. The storage vessel for articles of claim 1, wherein said support means includes a non-contacting type thrust magnetic bearing.

3. The storage vessel for articles of claim 1, wherein said support means includes a non-contacting type radial magnetic bearing.

4. The storage vessel for articles of claim 1, wherein said driving means includes a motor comprising a rotor fixed to said shaft and a stator facing said rotor.

5. The storage vessel for articles of claim 4, wherein said storage vessel case maintains a vacuum therein.

6. The storage vessel for articles of claim 4, wherein said storage vessel case maintains an atmosphere of inert gas therein.

7. A storage vessel for articles, comprising:
   a storage vessel case;
   a shaft rotatably disposed within said storage vessel case for rotation about an axis of said shaft;
   a plurality of receivers spaced from each other along said shaft and extending from said shaft for supporting a plurality of article carriers thereon;
   a non-contacting type support means for rotatably supporting said shaft and receivers within said storage vessel case without direct contact between said shaft and said storage vessel case, wherein said support means includes a non-contacting type thrust magnetic bearing and a non-contacting type radial magnetic bearing; and a driving means provided within said storage vessel for causing said shaft to rotate within said storage vessel case, wherein said driving means includes a motor comprising a rotor fixed to said shaft and a stator facing said rotor.

8. A storage vessel for articles, comprising:

a storage vessel case;

means for maintaining an interior of said storage vessel case under one condition of a vacuum condition or an atmosphere condition of inert gas;

a shaft rotatably disposed within said storage vessel case for rotation about axis of said shaft;

a plurality of receivers spaced from each other along said shaft and extending from said shaft for supporting a plurality of article carriers thereon;

a non-contacting type support means for rotatably supporting said shaft and receivers within said storage vessel case without direct contact between said shaft and said storage vessel case, wherein said support means includes a non-contacting type thrust magnetic bearing and a non-contacting type radial magnetic bearing; and a driving means provided within said storage vessel for causing said shaft to rotate within said storage vessel case, wherein said driving means includes a motor comprising a rotor fixed to said shaft and a stator facing said rotor.

* * * * *